United States Patent

Igel et al.

[11] Patent Number: 5,824,595
[45] Date of Patent: Oct. 20, 1998

[54] METHOD OF SEPARATING ELECTRONIC ELEMENTS

[75] Inventors: Gunter Igel, Emmendingen; Martin Mall, Freiburg, both of Germany

[73] Assignee: Deutsche ITT Industries GmbH, Freiburg, Germany

[21] Appl. No.: 720,771

[22] Filed: Oct. 3, 1996

[30] Foreign Application Priority Data

Oct. 17, 1995 [DE] Germany .................. 195 38 634.5

[51] Int. Cl.⁶ .................. H01L 21/301; H01L 21/46; H01L 21/78
[52] U.S. Cl. .................. 438/464; 438/458; 438/459; 438/460; 438/462; 438/977
[58] Field of Search .................. 438/33, 68, 113, 438/114, 458, 459, 460, 461, 462, 463, 464, 465, 759, 977, 385, 386, 485, 709, 710, 734, 735, 739; 216/72, 95

[56] References Cited

U.S. PATENT DOCUMENTS

| | | | |
|---|---|---|---|
| 4,236,296 | 12/1980 | Woolhouse et al. | 29/569 L |
| 4,418,472 | 12/1983 | Lorenzo, Jr. | 29/603 |
| 5,196,378 | 3/1993 | Bean et al. | 437/226 |
| 5,418,190 | 5/1995 | Cholewa et al. | 437/226 |

FOREIGN PATENT DOCUMENTS

| | | | |
|---|---|---|---|
| 4020195C2 | 7/1980 | Germany . | |
| 406188311 | 7/1994 | Japan | 438/386 |

OTHER PUBLICATIONS

Shumate et al., Silicon Wafer Thinning and Dicing Round or Non Orthogonal Die Using Dry Etching, Motorola Technical Developments, vol. 23, p. 8, Oct. 1994.
European Search Report Feb. 14, 1997.

Primary Examiner—John Niebling
Assistant Examiner—David A. Zarneke
Attorney, Agent, or Firm—Plevy & Associates

[57] ABSTRACT

A method for separating elements associated within a body includes creating a separation region within the body, between the elements, leaving a region of the body which is to be thinned. The method then requires depositing a delay layer on the body, with an opening around the separation region. The delay layer has a predetermined removal rate relative to the removal rate of the body. Lastly, the method requires removing a predetermined amount of the delay layer, the separation region, and the region of the body to be thinned. Preferably, the removing is accomplished by etching, such as plasma etching, and the etch rate of the delay layer is lower than the etch rate for the separation region. In a preferred method, the predetermined removal rate and the positions of the openings in the delay layer are selected so that upon after etching, the elements remaining have a predetermined locus dependent thickness. Alternatively, the delay layers may be formed from the base material, formed from a metallic material or made from a silicon dioxide ($SiO_2$) material. The base material is preferably a semiconductor wafer and the elements are semiconductor based electronic elements.

15 Claims, 3 Drawing Sheets

METHOD OF SEPARATING ELECTRONIC ELEMENTS

FIELD OF THE INVENTION

The present invention relates to a method of separating elements associated within a body, more particularly separating electronic elements.

BACKGROUND OF THE INVENTION

A known method of separating a semiconductor wafer into electronic elements is accomplished by mechanically cutting along saw lines. See German Publication No. DE 40 20 195. One of the disadvantages of such a method is that the sawing operation causes cracks which may extend into the active regions of the electronic elements. To reduce the formation of such cracks, complicated techniques are used, such as the formation of several grooves and the deposition of additional layers. These complicated techniques are expensive and cannot preclude cracking.

During the fabrication of electronic elements, further problems arise. Generally, since such a wafer is easier to process, a semiconductor wafer of relative great thickness is used. On the other hand, the electronic elements should have good heat transfer characteristics, low electrical resistance, and a small overall height, i.e., they should be as thin as possible. To meet these requirements, it is common practice to use a relatively thick semiconductor wafer which is thinned to a predetermined thickness at the end of the process. Since this is followed by further processing steps, including the separation step, a certain minimum thickness of the semiconductor wafer is required to ensure sufficient mechanical rigidity and load-carrying capacity of the wafer. The range of application of the electronic elements is limited by their thickness. In the case of a semiconductor wafer with a diameter of 200 mm, for example, the thickness, which corresponds to the thickness of the electronic elements, cannot be less than 200 micrometers. If semiconductor wafers with greater diameters are used, only electronic elements with even greater thickness can be fabricated. Thus, the properties that can be achieved with the electronic elements are limited. Comparable problems are encountered in the separation of other elements associated within a body, particularly of the elements referred to above.

Accordingly, it is the object of the present invention to provide an improved method of separating elements associated within a body.

SUMMARY OF THE INVENTION

The present method is for separating elements associated within a body. Initially, the method entails creating a separation region within the body, between the elements, leaving a region of the body which is to be thinned. The method then requires depositing a delay layer on the body, with an opening around the separation region. The delay layer has a predetermined removal rate relative to the removal rate of the body. Lastly, the method requires removing a predetermined amount of the delay layer, the separation region, and the region of the body to be thinned. Preferably, the removing is accomplished by etching, such as plasma etching, and the etch rate of the delay layer is lower than the etch rate for the separation region. In a preferred method, the predetermined removal rate and the positions of the openings in the delay layer are selected so that upon after etching, the elements remaining have a predetermined locus dependent thickness. Alternatively, the delay layers may be formed from the base material, formed from a metallic material or made from a silicon dioxide ($SiO_2$) material. The base material is preferably a semiconductor wafer and the elements are semiconductor based electronic elements.

Alternatively, the depositing step involves interposing the delay layer between the body and the elements. In this alternative embodiment, preferably, the removal rate and the positions of the openings in the delay layer are selected so that after the step of etching, the elements remaining have a predetermined locus dependent thickness.

BRIEF DESCRIPTION OF THE DRAWINGS

The invention will be better understood with reference to the following illustrative and non-limiting drawings, in which.

DETAILED DESCRIPTION OF THE INVENTION

Figure 1A:
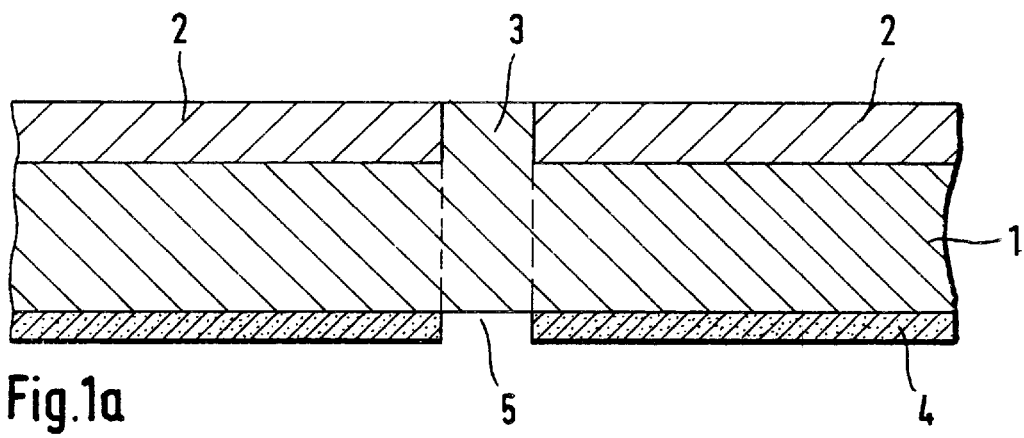
FIGS. 1a to 1c illustrate the method according to the invention for separating a semiconductor wafer into electronic elements.

Although the present method according to the invention has many possible applications, such as the separation of individual elements from multilayer circuit boards and the separation of ceramic circuit boards, sensors, and micro machines, the present invention is especially suited for semiconductor technology. Accordingly, the present invention will be described in conjunction with separating electronic elements that are associated within a semiconductor wafer and have to be separated.

The present invention is a method of separating elements associated within a body wherein the separation is accomplished by removing material of the body, and wherein an area of the body which is to be thinned, a delay layer for delaying the material-removing process is provided which has openings in the separation regions of the body. Thus, the thickness of the body can be reduced in the area of the delay layer during the separating process. The separation of the elements is then accomplished by removing the material in the separation regions of the body. The material of the delay layer must be so chosen that the removal is slowed down, so that the thickness of the body will be reduced more slowly than the separation region during the separating process. Thus, it is no longer necessary to process the body as a whole after the thinning process. Furthermore, the body need not be transported as a whole from one fixture to another, since the removal of material and the separation are performed in one fixture with the body being in a fixed position. Thus, a smaller thickness of the elements can be achieved. Mechanical rigidity of the individual elements is ensured since because of their smaller area, the elements can have a correspondingly smaller thickness.

Moreover, the process time can be reduced, since the separation operation and the material-removing operation, which otherwise would take place one after the other, are performed simultaneously. The separating operation can be started before the material-removing operation so that the two operations are then performed with the same speed. It is also possible to perform the separating operation faster than the material-removing operation, so that after the separation, elements with a predetermined thickness are obtained. Cracking during the separating process is reduced, since the material in the separating regions is removed. Such removal of material results in less cracking than mechanical cutting.

In a preferred embodiment of the invention, the separation of the elements and the removal of the material of the body are accomplished by etching, particularly by plasma etching. In this particular manner, cracking is reliably prevented. Furthermore, plasma etching makes it possible to carry out the method particularly fast. Advantageously, the delay layer has a lower etch rate than the material of the separation regions. In that case, a thin delay layer suffices to sufficiently delay the material-removing process with respect to the separating process.

Furthermore, it is advantageous if in the area to be thinned, at least one further delay layer with openings in depth regions is provided. The etch rate and the thickness of the delay layer/layers, the number of delay layers, and the positions of the openings in the respective delay layer may be so chosen so that after completion of the separating process, the elements have a predetermined, locus-dependent thickness. The elements can thus be fabricated in a predetermined thickness and shape. Different structures, steps, slants, curvatures, and the like of the elements can be formed on the side of the body on which the material is removed.

In another embodiment of the invention, the first delay layer is formed from the base material of the body. The thickness of the elements after the separating process is then determined solely by the thickness of the delay layer. Further delay layers may also be formed from the base material of the body.

In a further embodiment of the invention, the first delay layer is deposited on the back or front of the body, and the delay factor is so chosen that after completion of the separating process, a substantial portion of the first delay layer is preserved. The first delay layer may be made of metal. In that case, and particularly if the separation is accomplished by etching, only a very small portion of the delay layer will be removed, so that the thickness of the elements will essentially correspond to the thickness of the body and essentially a separating operation is performed. This ensures fast, low-cost separation of the electronic elements during which cracking is reliably prevented.

In another advantageous embodiment of the invention, the body is a semiconductor wafer, and the elements are electronic elements. This embodiment opens up a completely new application for electronic elements, since the latter can be fabricated from semiconductor wafers with a diameter of 200 mm and a thickness of 10 to 20 micrometers. Heat removal from large-scale-integrated electronic elements, for example, would then be substantially improved; in the case of high-performance electronic elements, dissipation is reduced, whereby efficiency increases; the small overall height permits wider use of electronic elements in chip cards.

Referring now to FIG. 1, there is shown a semiconductor wafer 1 with electronic elements 2 at different points of time during the process according to the present invention. FIG. 1a shows a cross section of part of the semiconductor wafer 1 at a first time. On the top surface of the semiconductor wafer 1, electronic elements 2 have been formed. Between the latter, a separation region 3 is provided which serves to separate the electronic elements 2 on the semiconductor wafer 1. The underside of the semiconductor wafer 1 is provided with a delay layer 4, which has an opening 5 in the separation region 3. The delay layer 4 is chosen to have a lower etch rate than the base material of the semiconductor wafer 1. The desired final thickness of the electronic elements 2 is determined by the thickness of the delay layer 4 and by the ratio of the etch rates of the semiconductor wafer 1 and the delay layer 4. The thickness and the material of the delay layer 4 are chosen accordingly. The semiconductor wafer 1 may be a silicon wafer, for example, and the delay layer 4 may be a layer of a silicon compound whose etch rate is lower than that of the silicon wafer. In determining the desired thickness of the electronic elements 2 and of the delay layer 4 to be deposited, the etchant must be taken into account, on which the etch rate of the delay layer 4 and the semiconductor wafer 1 is dependent.

Figure 1B:
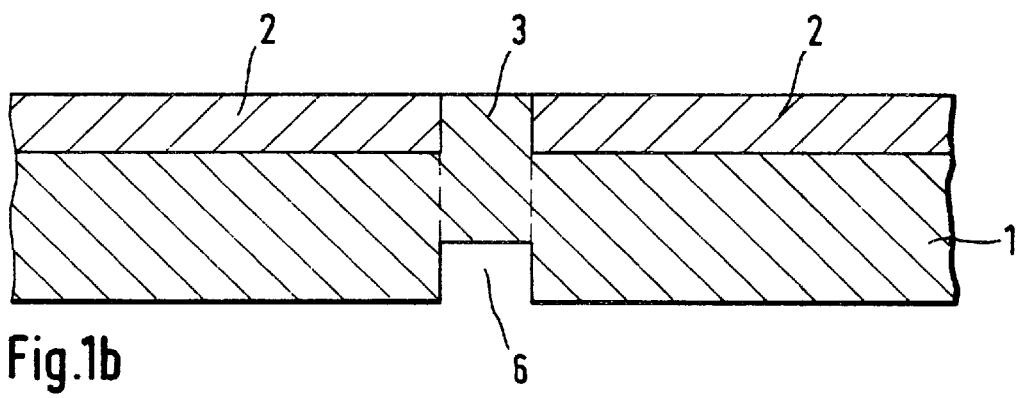

Referring to FIG. 1b, there is shown the same part of the semiconductor wafer 1 of FIG. 1a at a later time. The delay layer 4 has just been etched away. In the present case, since the etch rate of the delay layer 4 is one-half the etch rate of the semiconductor wafer 1, a portion 6 which is twice as thick as the delay layer 4 has been etched out of the semiconductor wafer 1 in the separation region 3. In the present example, the thickness of the portion 6 is equal to the desired final thickness of the electronic elements 2.

Figure 1C:
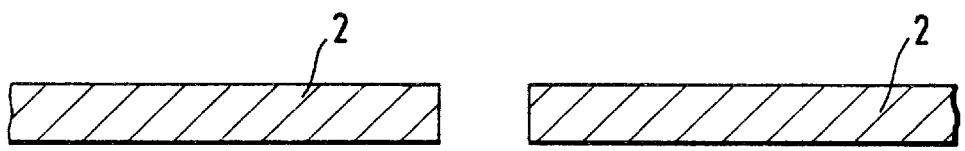

Referring to FIG. 1c, shown are the separated electronic components 2 after completion of the separation step. The material of the semiconductor wafer 1, which was still present in FIG. 1b, has been etched away. Since the material of the semiconductor wafer 1 is the same as the material in the entire separation region 3, e.g., silicon, and the etch rates in these regions are the same, the step in the separation region 3, formed in FIG. 1b by etching away the portion 6, is preserved and continuously removed during the etching process until the electronic elements 2 of the desired final thickness are completely separated.

It should be noted that FIGS. 1a to 1c only illustrate the principle of the method by an example. Further variants are possible; for instance, slight over etching may be performed beyond the separating process of the electronic elements 2.

Figure 2A:
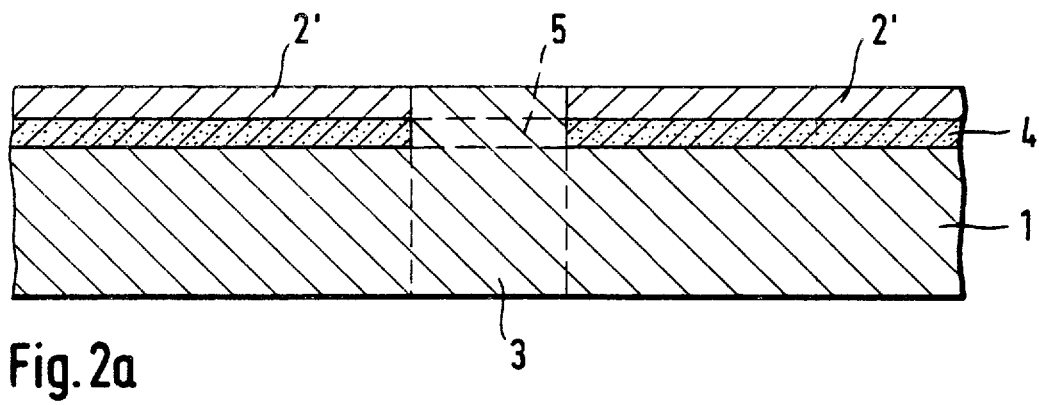
FIGS. 2a to 2c illustrate the method according to the invention for separating an SOI (silicon-on-isolator) structure into electronic elements.

Referring to FIG. 2a, there is shown a semiconductor wafer 1 with a silicon-on insulator (SOI) structure. The SOI structure consists of the delay layer 4, which is electrically insulating, and an overlying layer 2' which contains the electronic elements 2. The delay layer 4 has an opening 5 in the separation region 3 between the electronic elements 2. The delay layer 4 may be a silicon dioxide ($SIO_2$) layer.

Figure 2B:
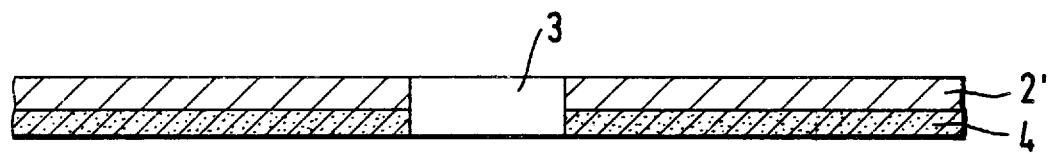
Figure 2C:
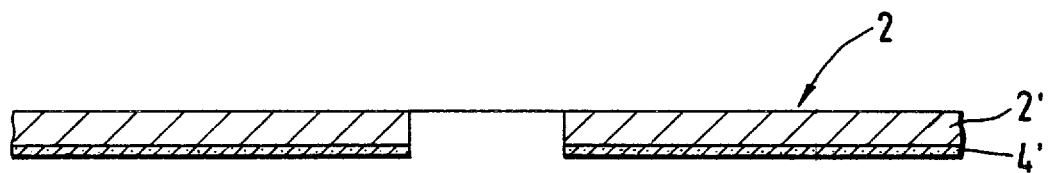

Referring to FIG. 2b, there is shown the semiconductor wafer 1 after the substrate portion of the silicon has been etched away up to the delay layer 4. Up to this point, the etching of the underside of the semiconductor wafer 1 takes place at the same rate. The delay layer 4 has an etch rate which is substantially lower than the etch rate of the silicon. As the etching continues, the silicon in the separation region 3 is etched faster than the $SiO_2$ layer, i.e., the delay layer 4. FIG. 2c shows the final condition, in which the electronic elements 2 have been separated. The portion 4' of the delay layer 4 forms part of the electronic elements 2. In this example, the ratio of the etch rate of the material in the separation region 3 to that of the material of the delay layer 4 is approximately 4:1.

Figure 3:
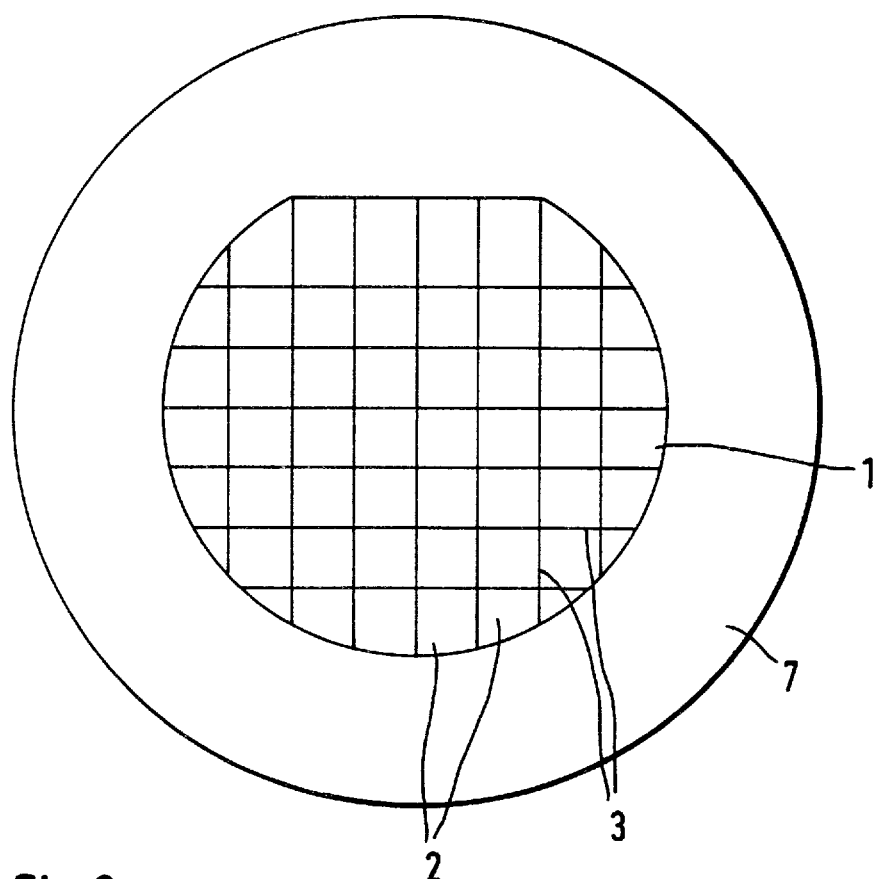
FIG. 3 is a schematic top view of a wafer containing electronic elements to be separated.

Referring to FIG. 3, there is shown an illustrative schematic representation in which a semiconductor wafer 1 has been joined to a foil 7 with an adhesive. The electronic elements 2 of the semiconductor wafer 1 are separated by separation regions 3. In all embodiments, an essential advantage of the method according to the invention is that throughout the material-removing and separating process, the semiconductor wafer 1 need not be transported, but the whole process can be carried out with the semiconductor wafer 1 being in a fixed position.

The methods illustrated in FIGS. 1 and 2 are only two of the possible embodiments of the invention. The method according to the invention can also be applied to other elements and bodies. For instance, it can also be used if wafers are combined in a multilayer substrate. At the contact region of the two wafers to be combined, a corresponding delay layer must then be provided beforehand. Also, applications are possible in which the selective etching is performed not on the back of the semiconductor wafer, but on the front. This is of importance if contacts on the front of the electronic elements are not desired. In that case, step structures can be formed in the surface for attaching the contacts. Portions of the surface which are not to be etched must then be covered with an etch stop layer, preferably a metal layer.

The method can also be used with the same advantages to separate multilayer printed-circuit boards, ceramic circuit boards, sensor elements, micromachines, etc.

It should be understood that the embodiments described herein are merely exemplary and that a person skilled in the art may make many variations and modifications to these embodiments utilizing functionally equivalent elements to those described herein. Any and all such variations or modifications as well as others which may become apparent to those skilled in the art, are intended to be included within the scope of the invention as defined by the appended claims.

What is claimed is:

1. A method of separating elements associated within a body during a continuous process of removing material from said body, said method comprising the steps of:

creating a separation region within said body between said elements leaving a region of said body to be thinned:

depositing a delay layer on said body for delaying the removal of material within the region of the body to be thinned, said delay layer having an opening around said separation region and a lower removal rate relative to said body; and, removing material from said delay layer, said separation region, and said region of said body to be thinned in said continuous process.

2. The method in accordance with claim 1, wherein said step of removing is accomplished by etching.

3. The method in accordance with claim 2, wherein said etching is plasma etching, and wherein said removal rate of said delay layer is an etch rate lower than an etch rate for said separation region.

4. The method in accordance with claim 1, wherein said step of depositing said delay layer includes interposing said delay layer between said body and said elements.

5. The method in accordance with claim 3 wherein said step of depositing said delay layer includes interposing said delay layer between said body and said elements.

6. The method in accordance with claim 1, wherein said removal rate and the positions of said openings in said delay layer are selected so that upon said step of removing, said elements remaining have a thickness dependent on said removal rate and said positions of said openings.

7. The method in accordance with claim 2, wherein said removal rate is an etch rate and the positions of said opening in said delay layer are selected so that after etching, said elements remaining have a thickness dependent on said removal rate and said positions of said openings.

8. The method in accordance with claim 4, wherein said removal rate is an etch rate and the positions of said openings in said delay layer are selected so that after etching, said elements remaining have a thickness dependent on said removal rate and said positions of said openings.

9. The method in accordance with claim 5 wherein said removal rate is an etch rate and the positions of said openings in said delay layer are selected so that after etching, said elements remaining have a thickness dependent on said removal rate and said positions of said openings.

10. The method in accordance with claim 4, wherein said removal rate and the positions of said openings in said delay layer are selected so that after said step of removing, said elements remaining have a thickness including said delay layer dependent on said removal rate and said positions of said openings.

11. The method in accordance with claim 1, wherein said delay layer is a plurality of layers each having a removal rate when subjected to a removing process.

12. The method in accordance with claim 11, wherein at least one of said plurality of delay layers is made from the material making up said body.

13. The method in accordance with claim 1, wherein said delay layer is made from one of a metallic material and a silicon dioxide material.

14. The method in accordance with claim 1, wherein said body is a semiconductor wafer and said elements are electronic elements.

15. A method of separating electronic elements in a semiconductor wafer and thinning said semiconductor wafer during a continuous process of removing material, comprising:

providing a delay layer for delaying the material—removing process within a semiconductor wafer body region to be thinned, said delay layer having at least one opening to a portion of said semiconductor body defined as a separation region, and removing material from said separation region of the semiconductor wafer, said delay layer, and said region of the body to be thinned, wherein the removal of material from said separation region separates said electronic elements, and wherein, upon completion of separation, said semiconductor wafer body has been thinned in said continuous process.

* * * * *